United States Patent [19]
Vinegar et al.

[11] Patent Number: 5,306,640
[45] Date of Patent: Apr. 26, 1994

[54] METHOD FOR DETERMINING PRESELECTED PROPERTIES OF A CRUDE OIL

[75] Inventors: Harold J. Vinegar; Pierre N. Tutunjian, both of Houston, Tex.

[73] Assignee: Shell Oil Company, Houston, Tex.

[21] Appl. No.: 114,793

[22] Filed: Oct. 28, 1987

[51] Int. Cl.$^5$ .............. G01R 33/08; G01R 33/20; G21B 49/08
[52] U.S. Cl. .................. 436/29; 324/307; 436/31; 436/173
[58] Field of Search .......... 436/29, 31, 173; 324/303, 300, 307

[56] References Cited

U.S. PATENT DOCUMENTS

| | | | |
|---|---|---|---|
| 3,268,800 | 8/1966 | Hoehn, Jr. et al. | 324/303 |
| 4,022,276 | 5/1977 | Dreher et al. | 166/250 |
| 4,291,271 | 9/1981 | Lauffer | 324/307 |
| 4,480,227 | 10/1984 | Brown | 324/303 |
| 4,564,811 | 1/1986 | Walker | 324/307 |
| 4,583,044 | 4/1986 | Case et al. | 324/309 |
| 4,656,422 | 4/1987 | Vail, III et al. | 324/303 |
| 4,728,892 | 3/1988 | Vinegar et al. | 324/309 |
| 4,769,602 | 9/1988 | Vinegar et al. | 324/303 |
| 4,866,983 | 9/1989 | Vinegar et al. | 73/153 |
| 4,884,455 | 12/1989 | Vinegar et al. | 73/798 |
| 4,893,504 | 1/1990 | O'Meara, Jr. et al. | 73/153 |

FOREIGN PATENT DOCUMENTS 0721736 10/1978 U.S.S.R. .

OTHER PUBLICATIONS

J. D. Robinson, et al., J. Pet. Tech., vol. 26, pp. 226-236, 1974.

Primary Examiner—Lyle A. Alexander
Assistant Examiner—Ramon Torres

[57] ABSTRACT

Methods are provided for using Nuclear Magnetic Resonance (NMR) spectroscopy to measure the bulk volume of oil and water in the polyurethane liner of sponge core. The method is accurate, rapid, and non-destructive. It provides information simultaneously in oil composition and viscosity.

5 Claims, 9 Drawing Sheets

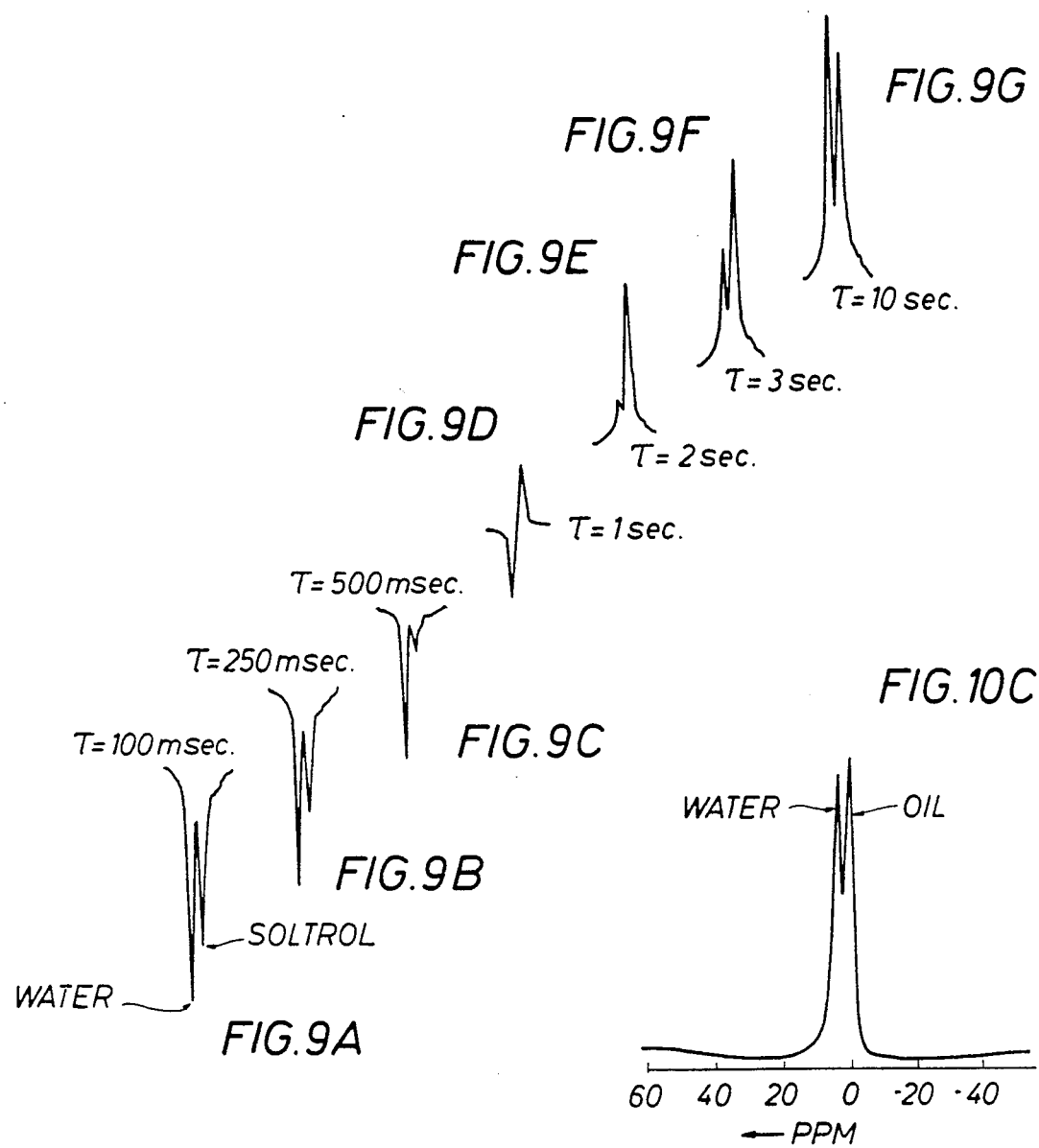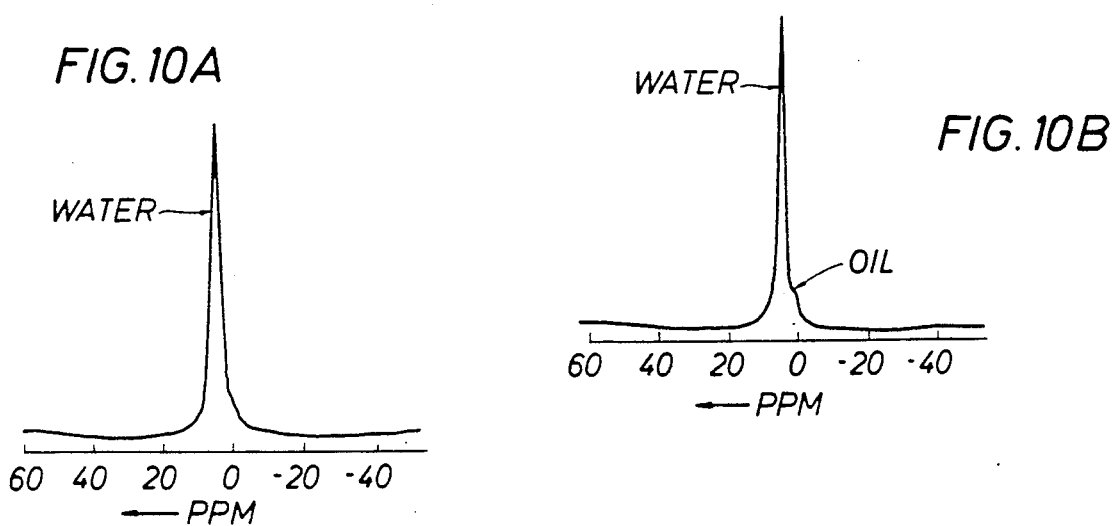

METHOD FOR DETERMINING PRESELECTED PROPERTIES OF A CRUDE OIL

CROSS-REFERENCE TO SIMULTANEOUSLY FILED RELATED APPLICATION

"Measurement of Oil Saturation And Properties In Aprotic Extracts by NMR Spectroscopy", Vinegar et al, Ser. No. 115,022.

BACKGROUND OF THE INVENTION

This invention relates to NMR spectroscopy and, more specifically, NMR spectroscopy of fluids contained in porous materials.

Coring of an earth formation is a routine procedure in oil production operations. A core is obtained in order to retrieve a small section of the reservoir formation that may be used to measure rock properties and determine insitu oil saturation.

Unfortunately, the coring process subjects the core to high fluid velocities and high pressures that disturb the core and any insitu fluids within the core. Solid particles such as barite in the drilling mud often invade deeply into the core. In addition, drilling fluids from either a water-based mud or an oil-based mud can invade the core and flush out some of the insitu oil saturation.

The standard analysis technique used in the oil industry for determining oil saturation in cores to be cut small 1" outside diameter plugs every foot of the core and extract the plugs using the Dean-Stark extraction technique. This is a laborious and expensive procedure. Moreover, this procedure will often sample those parts of the core that have been seriously flushed by mud filtrate and have had their oil saturations reduced. Thus, the oil saturations for core plugs are typically understood to be the minimum possible oil saturation in the reservoir, while the true unflushed oil saturation in the reservoir is often significantly higher.

Sponge coring is an attractive alternative to the blow-down losses of conventional coring, without the expense and low recovery associated with pressure core. A sponge core barrel traps the oil expelled from the core in an oil-wet, high porosity polyurethane sponge surrounding the core. At the surface, cored sections are stored in completion brine or frozen and then transported to the laboratory to determine the quantity of oil trapped in the sponge.

The present method of determining the fluid saturations in the sponge is by solvent extraction. Typically two days are required for the extraction process on each one foot section of sponge. The solvent must then be separated from the extracted oil and water volumes. Finally, the oil volume must be corrected for non-reacted components of the polyurethane which are removed along with the oil in the extraction.

These and other limitations and disadvantages are overcome by the present invention, however, and methods are provided for obtaining insitu oil saturations from core.

SUMMARY OF THE INVENTION

In a preferred embodiment of the invention, methods are provided for more accurately determining in-situ oil and brine saturation in porous samples using NMR. Additional characteristics of the oil and/or brine in the samples may also be determined. The samples may be either an earthen core sample and/or the polyurethane liner of a sponge core, or drill cuttings.

As an alternative to solvent extraction, the present invention provides methods for the use of Nuclear Magnetic Resonance (NMR) for rapid non-destructive analysis of sponge core. The advantages of NMR are high accuracy, since chemical extraction is not required, and high speed, since an NMR spectra of each foot of sponge core can be obtained in seconds. In addition, NMR information about oil composition and viscosity can be obtained simultaneously.

NMR spectroscopy is a rapid, nondestructive method for measuring oil/water saturations and porosity on carbonates and clean sandstones. This results in core analysis costs about 1/5 that of standard Dean-Stark extraction. NMR spectroscopy can also be more accurate than Dean-Stark extraction when the extraction is incomplete or when dewatering occurs of gypsum or other temperature sensitive minerals in the core.

It is an object of the present invention to provide methods for measuring in-situ oil and brine saturations in a porous sample.

It is an object of the present invention to provide methods for measuring chemical and physical properties of oil and brine in a porous sample.

These and other objects and advantages of the present invention will become apparent from the following detailed description wherein reference is made to the figures in the accompanying drawings.

BRIEF DESCRIPTION OF THE DRAWINGS

FIGS. 9A-G show $^1$H NMR spectra of sponge saturated with water and SOLTROL obtained using an inversion recovery sequence with the corresponding $\tau$ delays between the 180° and 90° pulses.

FIGS. 10A-C show the proton NMR spectra of core plugs with A corresponding to $S_o=0.00$, B corresponding to $S_o=0.03$, and C corresponding to $S_o=0.45$, with the spectra normalized to the largest peak height.

DETAILED DESCRIPTION

Figure 1:
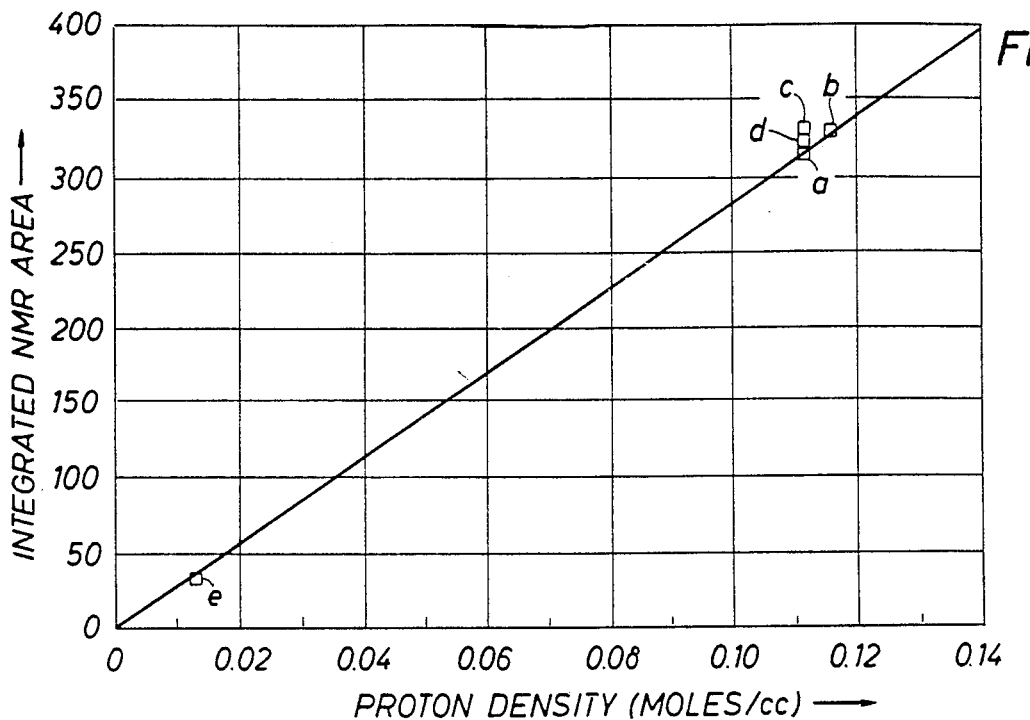
FIG. 1 shows measured and computer proton densities for various oils.

NMR spectroscopy of saturated sponge is based on the chemical shift differences between oil and water protons. Chemical shifts are the differences in the magnetic field strength at which resonances are obtained for nuclei of the same kind (such as protons) but located in different molecular environments (such as aliphatic vs aromatic structures). They are typically expressed in parts per million (ppm) of the main magnetic field: for example, —CH$_2$— resonance of aliphatic protons are at 1.2 ppm while the OH resonance of water protons are at 5.3 ppm, relative to a standard material, tetramethylsilane (TMS).

A General Electric CSI-2T pulsed NMR spectrometer was used for these measurements. The CSI-2T has a superconducting magnet with 310 mm bore and an RF coil which can obtain spectra from a sample volume 4.5 in. o.d. by 8 in. long. The large magnet bore means that about 50 cu in. of sponge can be measured simultaneously in the central region of the RF coil shimmed for best magnetic field homogeneity.

Other spectrometers may also be employed in the practice of the methods of the present invention. Such NMR spectrometers should be high resolution spectrometers with a resolution of about 1 ppm (although a resolution of at least 0.1 ppm is preferred) and have a high magnetic field to provide faster data acquisition and higher frequency Larmor frequencies for improved signal-to-noise ratios.

The aliphatic proton density of oils (including isoalkane, N-alkane, and cyclo-alkane types of oils) averages 0.113 moles/cc at 20° C., with very little variation from crude oil to crude oil so that a sample of the particular crude oil being tested is not required. The aromatic proton density of oils averages 0.068 moles/cc at 20° C., again with little variation from oil to oil. Further, a weighted average of aliphatic and aromatic proton densities may be employed for the particular oil being tested. This weighted average may be constructed from the fractions of aliphatics and aromatics found in the $^1$H NMR spectra of the oil. The weights or fractions are determined from the area under the respective portions of the $^1$H NMR spectra. Thus, the proton density, D$_o$, (in moles/cc) in the oil may be determined from $$D_o = F_{al}D_{al} + F_{ar}D_{ar} \quad (1)$$

where F$_{al}$ and F$_{ar}$ are the aliphatic and aromatic fractions as determined by $^1$H NMR spectroscopy and D$_{al}$=0.113 moles/cc (the aliphatic proton density) and D$_{ar}$=0.068 moles/cc (the aromatic proton density). For example, for a 5% aromatic fraction (i.e., where the area under the aromatic portion of the $^1$H NMR spectra is 5% of the total area under both the aliphatic and aromatic portions of the $^1$H NMR spectra)

$$D_o = (0.95)(0.113) + (0.05)(0.068) = 0.111.$$

Once the proton density D$_o$ is determined, or an average value, such as 0.111, is assumed, the intensity of the oil spectra, I$_o$, as determined by the total area under the oil spectra, may be combined with similar information for a known volume of a reference fluid to obtain the volume of the oil, V$_o$. More particularly, the volume of the reference or standard, V$_R$, is known, as is the proton density, D$_R$, of the reference or standard. The intensity, I$_R$, of the reference or standard is the total area under the NMR spectra of the reference or standard. That is, V$_o$ may be obtained from the following equation, $$V_o = V_s \frac{D_R I_o}{D_o I_R}. \quad (2)$$

The oil saturation in the core may then be computed from the volume of oil in the extract divided by the pore volume, V$_p$, of the core. The pore volume, V$_p$, may be determined by conventional hydrostatic weighing of the core in toluene. The oil saturation, S$_o$ is thus determined from, $$S_o = \frac{V_o}{V_p}, \quad (3)$$

where V$_o$ is the oil volume from NMR spectroscopy. If V$_w$ is the volume of brine or water determined by NMR spectroscopy then its saturation, S$_w$, may be determined from, $$S_w = \frac{V_w}{V_p} \quad (3a)$$

Further, the gas saturation, S$_g$, may be determined by $$S_g = \frac{(V_p - V_o - V_w)}{V_p}. \quad (4)$$

However, it is also possible to determine the pore volume, V$_p$, from NMR. NMR may be used to determine pore volume if the pores are all filled with fluid or fluids capable of providing NMR signals. More specifically, a core sample may be scanned before extraction (if the core volume is fully filled by brine and/or oil) and the total signal is representative of the total porosity.

The integrated area under each proton resonance is proportional to the proton concentration of that chemical species. Since oil and water have nearly identical proton concentration per unit volume (i.e. 0.111 moles/cc), the integrated areas under those resonances are proportional to the bulk volume of oil and water in the sample. FIG. 1 compares the proton density of equal volumes of several oils and water with measurements of the integrated intensity under their NMR resonances. An internal NMR reference standard can be used for absolute calibration. For oil/water spectroscopy, trifluoroacetic acid (TFAA) at 12 ppm is a better standard than TMS at 0 ppm since TMS overlaps partially with the aliphatic oil resonance. A vial containing a measured amount of TFAA can be placed inside the RF coil together with the sponge as an internal reference standard. A series of NMR spectra were obtained on various sections of sponge core. Dry sections of sponge, 4"×1"×1", were removed from the aluminum core barrel and saturated in different fluids under a vacuum.

Figure 2A:
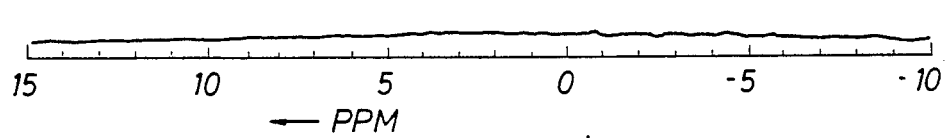
FIGS. 2A-B show $^1$H NMR spectrum of the dry sponge, with FIG. 2A shown on the same scale as the spectra in FIGS. 3 and 4, and with FIG. 2B shown expanded by a factor of 100.
Figure 2B:
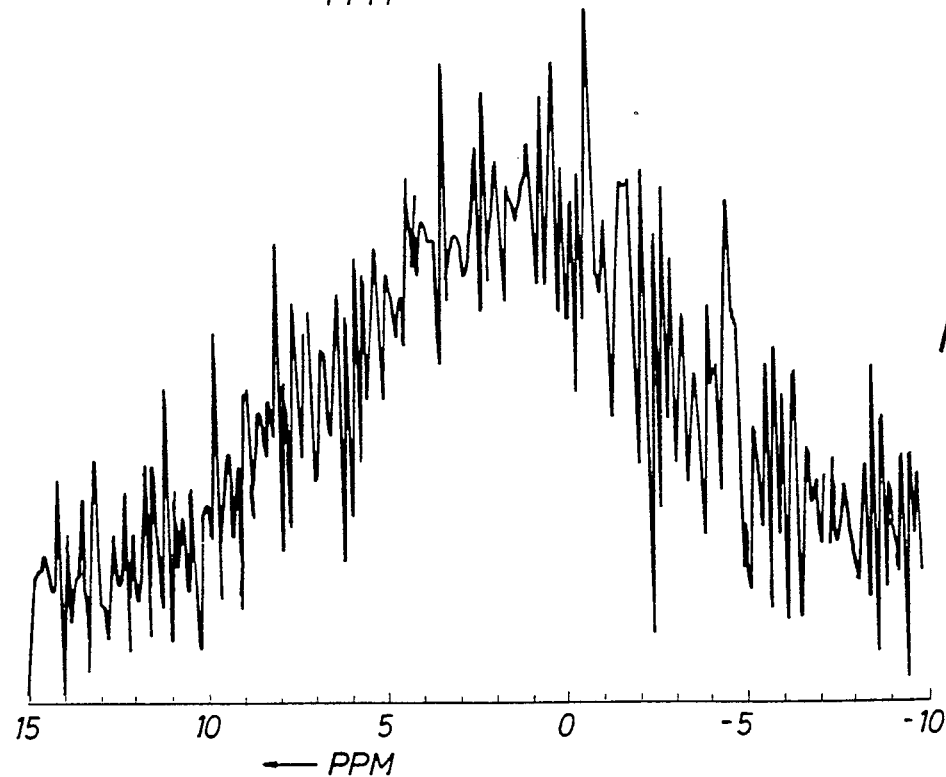
Figure 3:
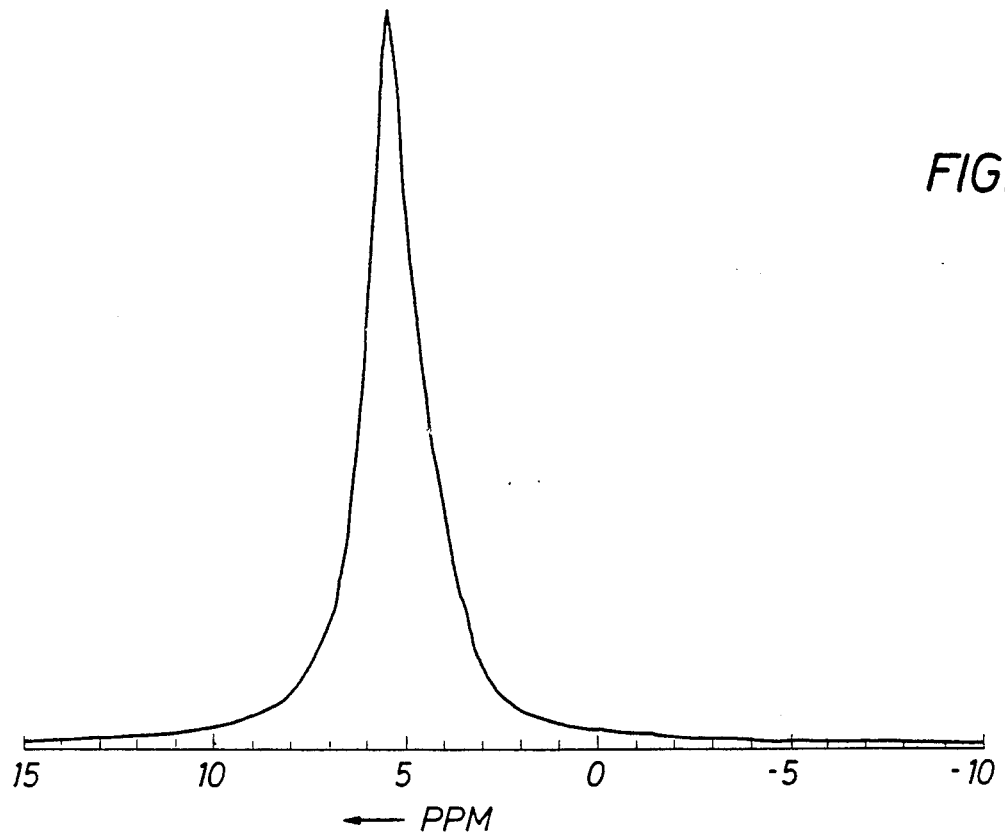
FIG. 3 shows $^1$H NMR spectrum of water-saturated sponge.
Figure 4:
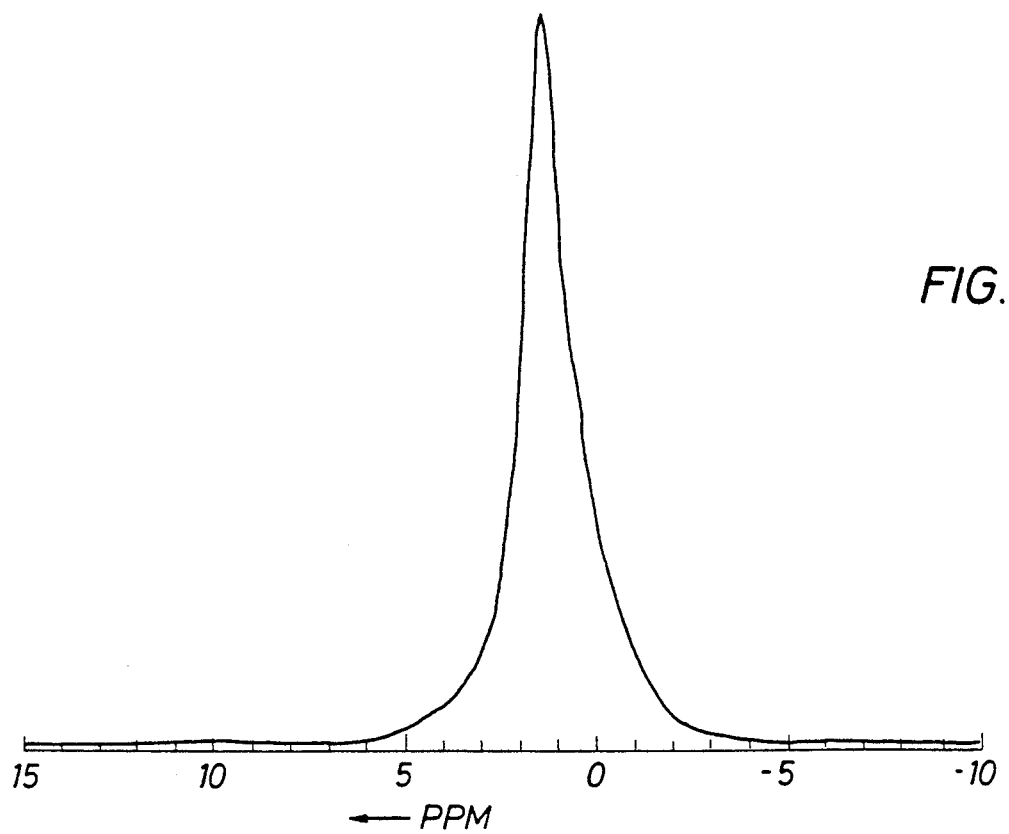
FIG. 4 shows $^1$H NMR spectrum of Soltrol-saturated sponge.

FIG. 2a shows the NMR spectrum of the dry sponge with identical acquisition parameters to those used in FIGS. 3 and 4. At this level the dry sponge contributes no detectable signal. FIG. 2b shows the dry sponge signal expanded by a factor of 100, showing a broad resonance of about 10 ppm full width half maximum (FWHM) detectable at 2:1 above system noise. For practical purposes the NMR contribution from the dry sponge may be ignored.

FIG. 4 shows the NMR spectrum of a sponge fully saturated with SOLTROL. The spectrum represents four pulsed acquisitions of three seconds each. A single peak from SOLTROL is evident at a chemical shift of 1.2 ppm with a linewidth of 1.5 ppm FWHM.

FIG. 3 shows the NMR spectrum of a water-saturated sponge. The water resonance is at 5.3 ppm and the linewidth is also 1.5 ppm FWHM.

Figure 5:
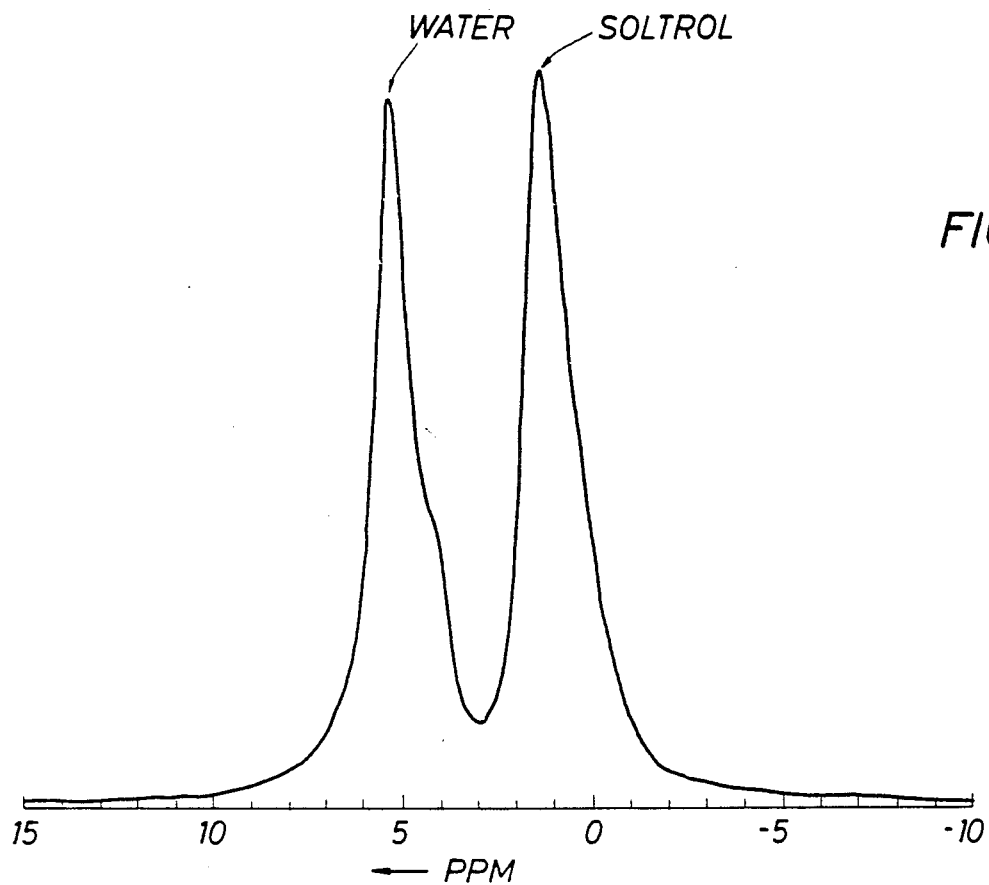
FIG. 5 shows $^1$NMR spectrum from two sponges with one sponge saturated with water and the other sponge saturated with Soltrol.

FIG. 5 shows the NMR spectrum of the SOLTROL-saturated and water-saturated sponges measured in the spectrometer at the same time. The oil and water lines are well-resolved in the spectrum despite the 1.5 ppm broadening due to the sponge.

Figure 6:
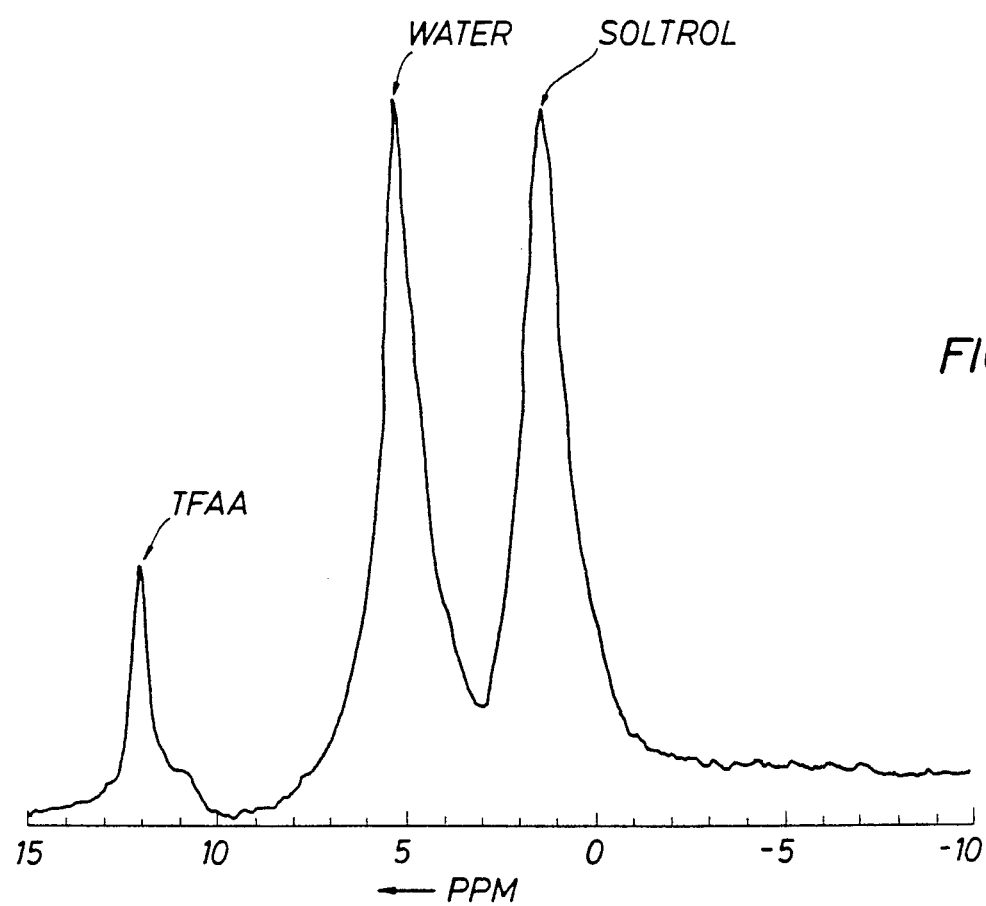
FIG. 6 shows $^1$H NMR spectrum of a sponge saturated with both water and Soltrol and the resonance at 12 ppm is due to the TFAA internal standard.

FIG. 6 shows the NMR spectrum of a single sponge saturated with equal parts SOLTROL and water. Since the oil and water lines are nearly baseline resolved, the determination of separate water and oil bulk volumes is simplified. There is little difference between the spectra obtained with water and oil in the same sponge (FIG. 6) and in different sponges (FIG. 5), which demonstrates the ability to analyze multiple samples at the same time.

Figure 7:
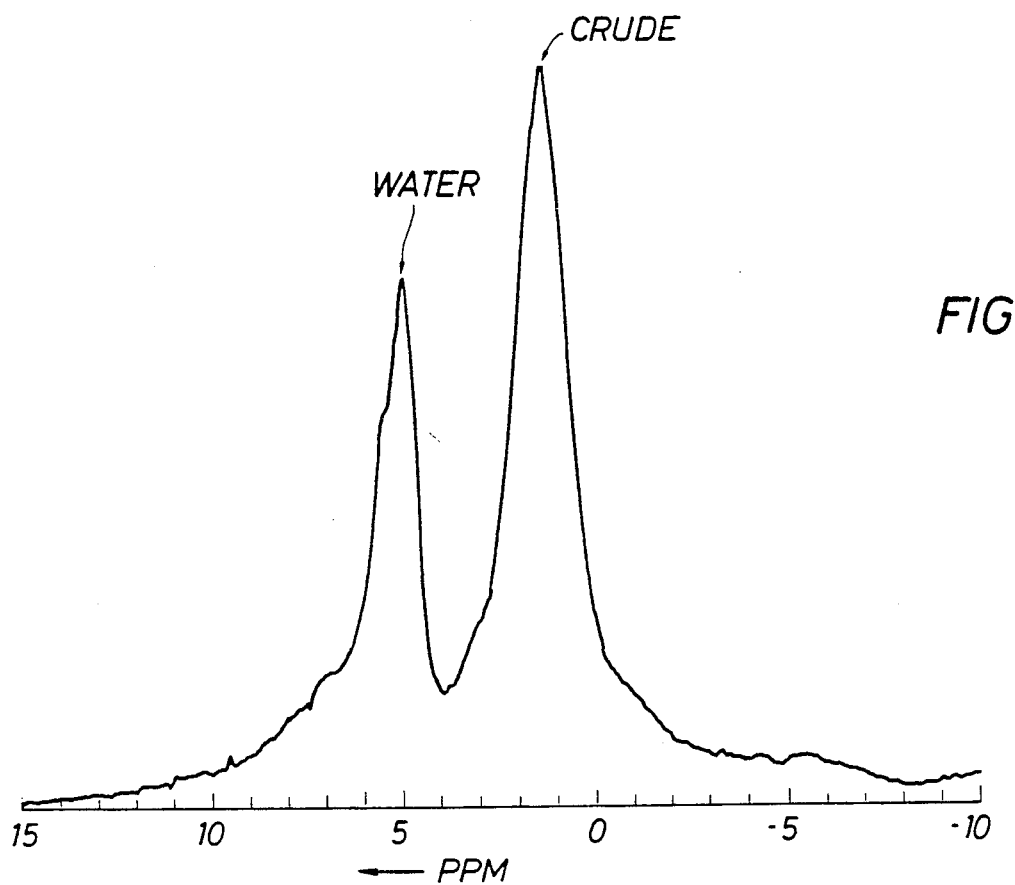
FIG. 7 shows $^1$H NMR spectrum of sponge saturated with an actual crude oil and water.
Figure 8:
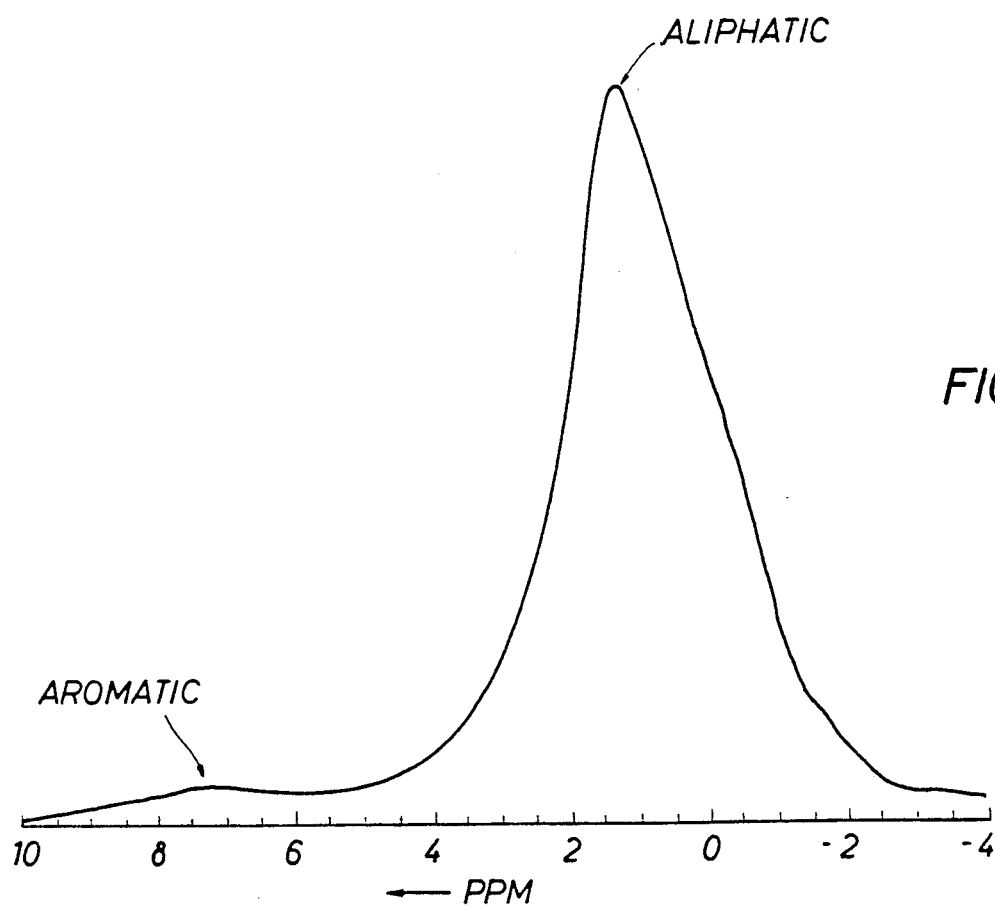
FIG. 8 shows $^1$H NMR spectrum of sponge saturated with an actual crude oil and the resonances at 7.2 ppm and 1.2 ppm correspond to aromatic and aliphatic protons, respectively.

FIG. 7 shows the NMR spectrum of a sponge containing an actual crude oil and water. The separate resonances are still baseline resolved. An expanded portion of the crude oil spectrum obtained from a sponge containing only crude oil is shown in FIG. 8. The separation between the aliphatic components at 1.2 ppm and the aromatic components at 7.2 ppm is evident. Integration of the aliphatic and aromatic portions of the spectrum shows the crude contains 3% aromatic protons. Fortunately, the aromatic resonance in 7.2 ppm does not overlap significantly with the 5.3 ppm water resonance. The aliphatic/aromatic analysis could be useful in measuring changes in oil composition and origin in long cored intervals.

In FIG. 9 an inversion recovery pulse sequence is used to measure the $T_1$ relaxation time of all components of the NMR spectrum from a sponge containing SOLTROL and water in order to measure the viscosity of the oil. The measured relaxation times are 1.1 sec for SOLTROL and 2.1 seconds for water. Using $T_1$ correlations such as those in the hereinbefore cited cross-reference application, it is possible to obtain an estimate of the crude oil viscosity. For specific crudes a particular correlation may be determined, for example for the actual crude tested the product of $T_1$ and viscosity is approximately equal to 1.6 cp-seconds. The SOLTROL viscosity is estimated to be 1.45 cp, in good agreement with the actual value of 1.3 cp.

Practical implementation of NMR spectroscopy for sponge core analysis requires procedures for removing the frozen sponge from the aluminum core barrel and allowing the sponge to thaw without evaporation of light ends. A jig has been constructed to push 6" sections of frozen sponge out of the aluminum barrel by applying vertical pressure from a press to the sponge sections while the aluminum barrel is supported at its base. The frozen sponges can then be placed inside sealed polyethylene bags and allowed to thaw before NMR spectroscopy.

Alternatively, the sponge core barrel may be constructed from fiberglass or other non-metallic, non-magnetic materials, which will not scatter the radiofrequency magnetic field as aluminum does. This eliminates the step of removing the frozen sponge from the aluminum core barrel.

Although it was generally believed that $^1H$ NMR spectroscopy on cores would result in linewidths too broad to resolve oil and water resonances, much of the broadening has been found to be due to sample shape-dependent magnetic susceptibility broadening which can be compensated with magnetic field shimming. Thus, $^1H$ NMR linewidths have been obtained in carbonates and clean sandstones of about 1.5-2 ppm, which is sufficient for spectrally-resolving oil and water resonances (oil-water frequency separation=5 ppm). This opens up all the capabilities of $^1H$ NMR spectroscopy for nondestructive core analysis.

In the first set of experiments, the core samples were frozen 1" o.d.×1.5" long plugs cut every foot from a carbonate core and allowed to thaw inside TEFLON capped glass vials. NMR spectroscopy was performed on the core plugs while inside the vials, so that any liquid evaporated from the plugs would also be measured. The vials were placed inside a special TEFLON positioner for accurate repositioning inside the RF coil in the magnet.

NMR spectroscopy was performed with the General Electric CSI-2T spectrometer discussed hereinbefore, using a 3" i.d. RF coil. A standard 90 degree pulse-and-acquire sequence was used with 32 acquisitions.

Ten minutes per plug was required for sample positioning, data acquisition, and deconvolving the NMR spectra into separate oil and water resonances. Thus, forty core plugs were analyzed per day at about 1/5 the cost of standard Dean-Stark extraction.

FIGS. 10A–C are examples of the NMR spectra for core plugs with $S_o=0$, $S_o=0.03$ and $S_o=0.45$, respectively, where $S_o$ is the oil saturation. The NMR linewidths of approximately 2 ppm are sufficiently narrow compared to the 5 ppm separation of oil and water peaks to allow good spectral resolution. The spectrum with $S_o=0.03$ is approximately at the deconvolution limit where the oil resonance cannot be detected above the much larger water resonance.

Figure 11:
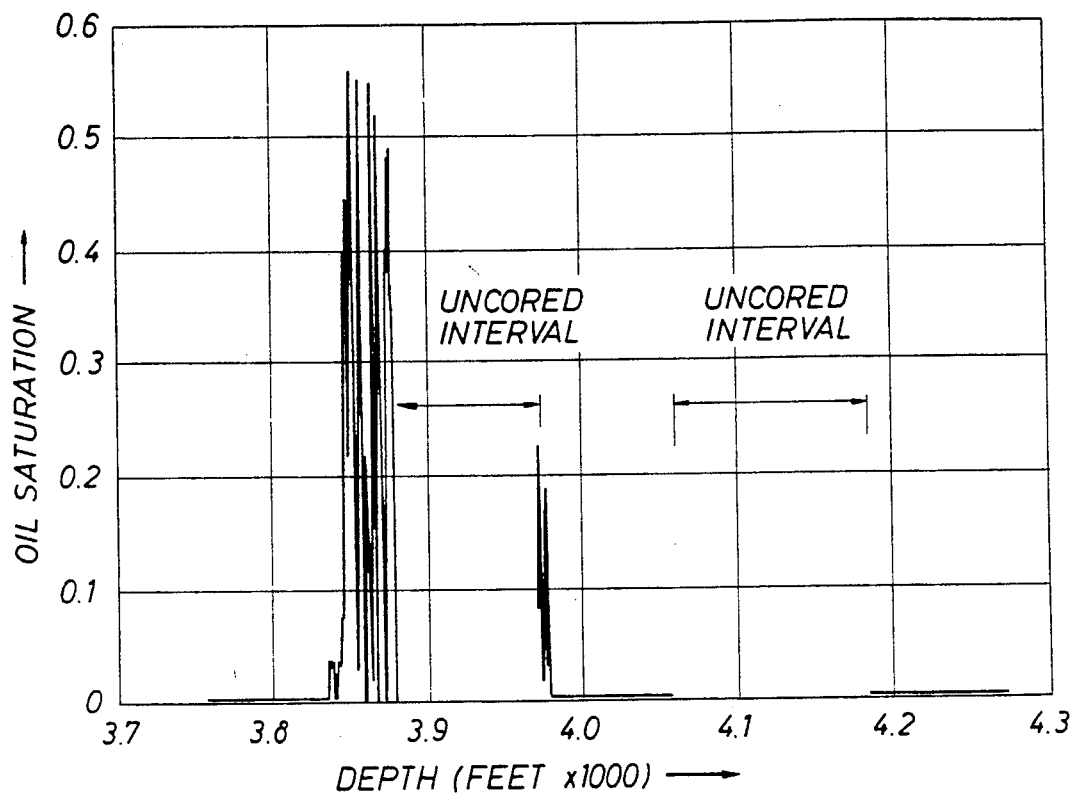
FIG. 11 shows a log of oil saturation in core measured by NMR vs. depth.
Figure 12:
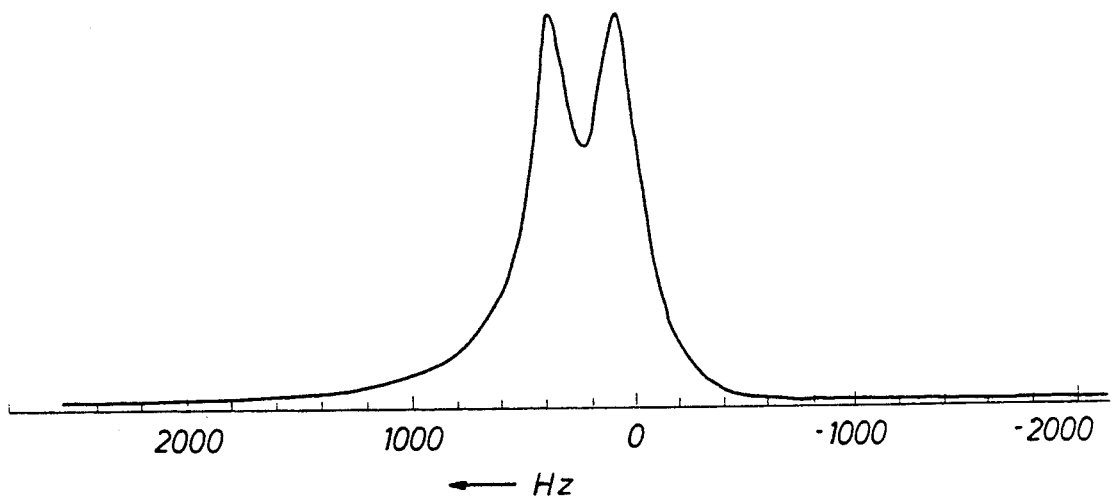
FIG. 12 shows the NMR spectra of one foot of whole core showing well-resolved oil and water resonances.
Figure 13:
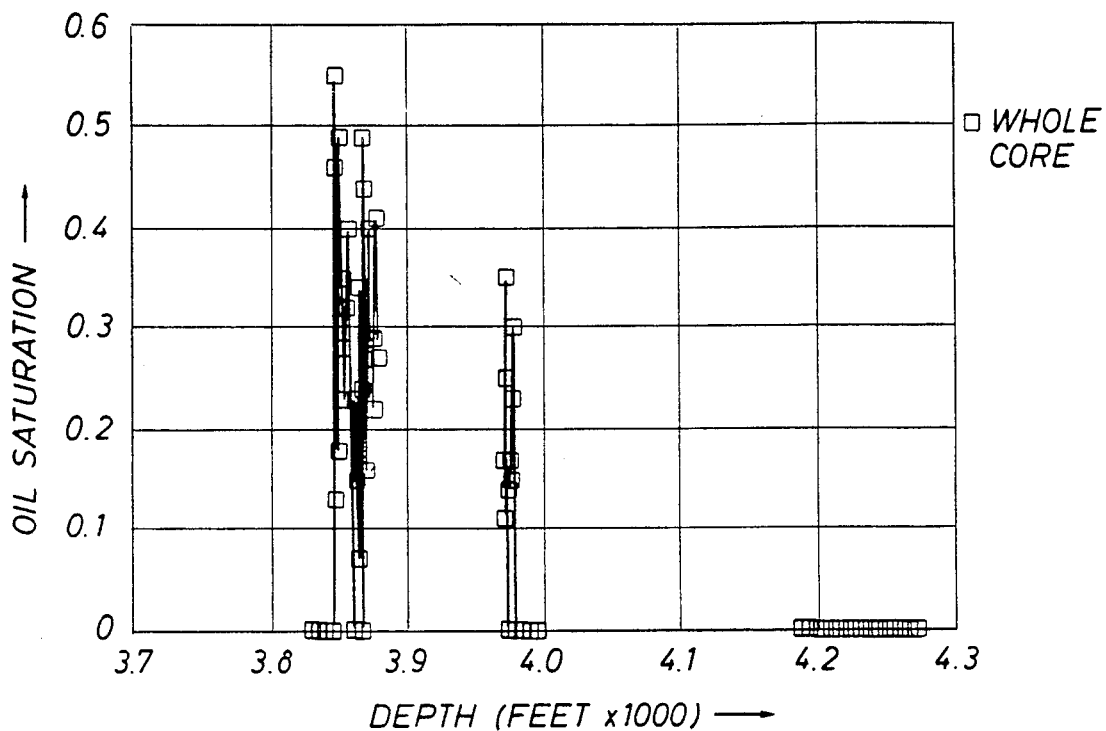
FIG. 13 shows the NMR log of oil saturation in the whole core versus depth.

FIG. 11 shows a log of NMR determined oil saturation in the core versus depth. As in many carbonates, the oil saturation appears to be highly variable on the plug-to-plug basis. This suggests that whole core spectroscopy would give more representative sampling. The whole core (3¾" o.d.) was measured in one foot sections by $^1H$ NMR spectroscopy in the CSI 2T spectrometer, using a 4½" i.d. R.F. coil. FIG. 12 shows the NMR spectra of one foot of whole core showing well-resolved oil and water resonances. FIG. 13 shows the NMR log of oil saturation in the whole core versus depth.

The accuracy of NMR spectroscopy for quantifying oil-water saturation within the core plugs is within 5%. The primary error sources are (1) deconvolving the NMR spectra into separate oil and water resonances, and (2) variations in proton density among different crudes. Experimental data from various fields show variations of 0–5% for the crude oil aliphatic proton density relative to the proton density of water at 25° C. The latter source of error can be reduced further if a representative sample of the crude is available for calibration. This may be obtained by centrifuging a small sample of core and separating the crude oil from fluids discharged during centrifuging.

Figure 14:
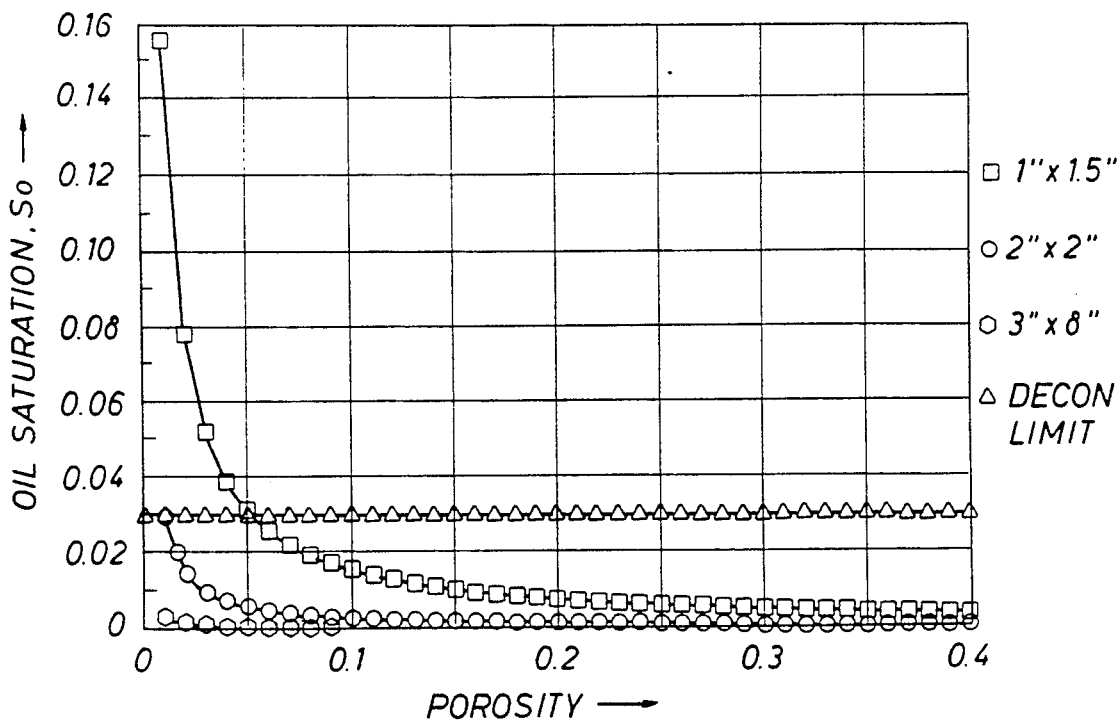
FIG. 14 shows NMR detection limits for $S_o$.

The limits of NMR detection of oil saturation in core plugs depend on both the oil volume detection limit and the spectrum deconvolution limit. The oil volume detection limit was determined by measuring successively smaller volumes of oil until the signal peak height was about twice the background response from coil, sample holder, and empty vial. The spectrum deconvolution limit of $S_o = 3\%$ was estimated from synthetic spectra using the linewidths observed for the actual samples from this field. Since NMR detects fluid volumes, the lowest oil saturation detectable will depend on both the porosity and size of the sample, as shown in FIG. 14. For $1'' \times 1.5''$ plugs, the oil volume detection limit of 0.03 cc implies a detectable oil saturation limit greater than the 3% deconvolution limit for sample porosities below 5%. For larger plugs and higher porosity samples, the oil saturation detection limit is determined by the 3% spectrum deconvolution limit.

Figure 15:
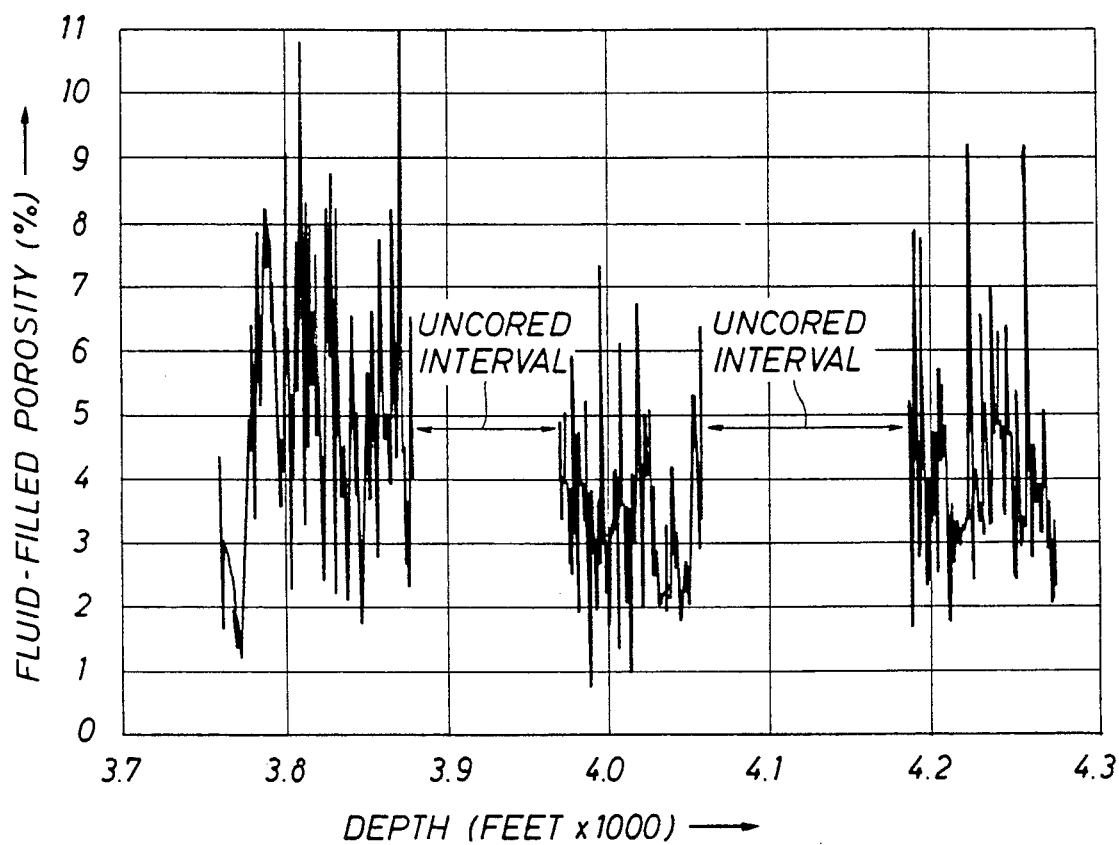
FIG. 15 shows a log of fluid-filled porosity in core measured by NMR vs. depth.

NMR spectroscopy was also used to measure the fluid-filled porosity of the core plugs from this oil field as shown in FIG. 15. The porosity was computed from the total proton signal (oil and water) converted to fluid volume and divided by the bulk volume of the core. FIG. 15 shows the fluid-filled porosity measured on a one foot section of the whole core.

The fluid-filled porosity of a core may be less than the total porosity if gas is present due to reservoir gas saturation, blowdown losses, core expansion at the surface, fluid evaporation, etc. The field's crude oil however, was not believed to be gassy, and the tightness of the core should reduce blowdown losses. In order to check for gas in the core, NMR measurements were made on a plug before and after vacuum immersion overnight in SOLTROL. The measured fluid content increased from 0.38 cc to 0.40 cc, a 5% change.

Figure 16:
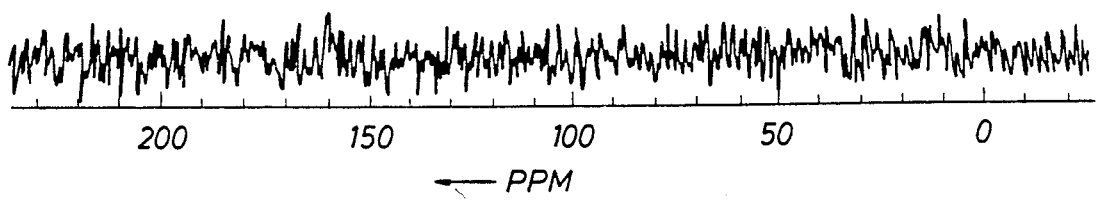
FIG. 16 shows $^{13}$C NMR spectroscopy of a water saturated dolomite core plug.
Figure 17:
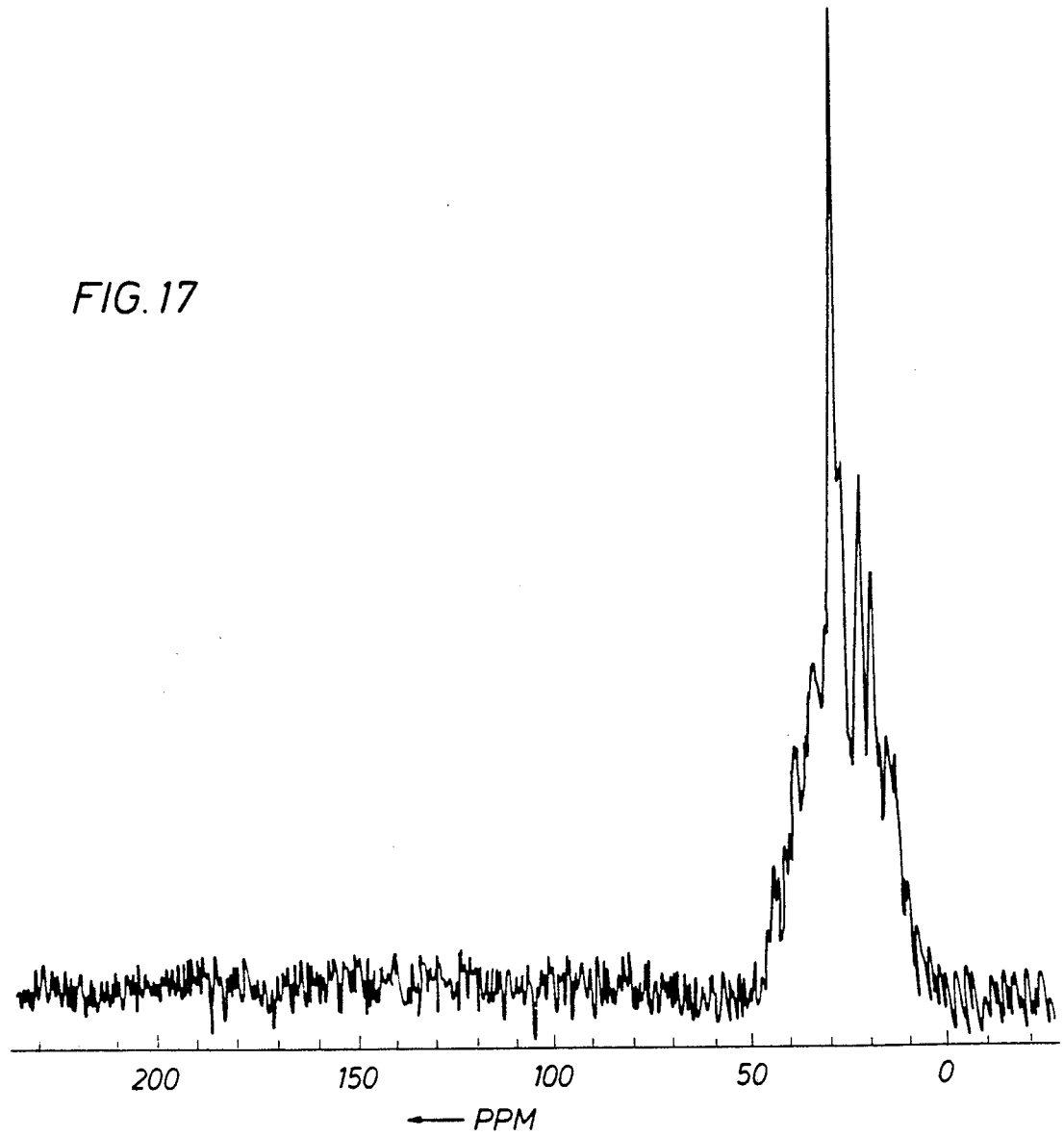
FIG. 17 shows $^{13}$C NMR spectroscopy of a soltrol saturated dolomite core plug.

Further, $^{13}C$ NMR spectroscopy may be employed to measure oil saturation, particularly in shaly sands where the $^1H$ NMR resonance is too broad to resolve oil protons from water protons. With $^{13}C$ NMR spectroscopy only the carbon nuclei in the oil will be detected, since water contains no carbon atoms. Moreover, the carbon nuclei in solid minerals such as carbonates will not be measured because of very short relaxation times and wide NMR linewidths. FIG. 16 and FIG. 17 show the $^{13}C$ spectra of two samples of Bakers dolomite, one saturated with water and the other with SOLTROL, respectively. The SOLTROL has no aromatic constituents and thus no aromatic spectra. These spectra were obtained in ten minutes of signal averaging on a General Electric QE 300 spectrometer. No $^{13}C$ signal is detected in the water saturated dolomite showing that the carbon atoms of solid carbonate minerals are not detected.

As described hereinbefore for $^1H$ NMR spectroscopy, $^{13}C$ NMR spectroscopy may also be employed to determine the quantity or volume of liquid hydrocarbons in the sample. The aliphatic carbon density of oils average 0.052 moles/cc at 20° C., and the aromatic carbon density in oil averages 0.091 moles/cc at 20° C. From these carbon densities and associated fractions of aromatic and aliphatic carbons, the weighted carbon density of the oil may be determined, as described hereinbefore for proton densities. Once the carbon density of the oil is known, or assumed, it is then possible to determine the volume of the oil in the sample in the same manner as described hereinbefore for proton density and determination of oil volume therefrom. Further, the $^{13}C$ NMR spectra of the crude oil may be characterized and correlated, i.e. "finger-printed", to determine if the oil from different parts of a reservoir are the same, which would demonstrate continuity of a geologic unit. However, the low $^{13}C$ sensitivity results in much longer analysis time than $^1H$ NMR spectroscopy.

Once the $^{13}C$ spectra and $^1H$ spectra for an oil or oil product have been determined, it is then possible to determine chemical properties, such as the carbon to hydrogen ratio, carbon aromatic to aliphatic ratio, and proton aromatic to aliphatic ratio, which may be used to determine the maturity of the source rock for oil.

Further, it is possible to perform various so-called "2D" NMR techniques, such as heteronuclear correlated "2D" NMR spectroscopy. The heteronuclear correlated "2D" technique cross-plots the $^1H$ and $^{13}C$ connectivities and yields detailed structural information about the oil or oil product.

NMR spectroscopy also provides estimates of oil viscosity and surface wettability from the proton $T_1$ relaxation times of oil and water resonances. As determined by NMR, the oil viscosity in the plugs was between 1 and 3 cp at room temperature, which agreed with the viscosity of the oil extracted from one sample using pressurized solvent and with the viscosity from $T_1$ measurements on solvent extracts of the plugs. In addition, successive NMR $T_1$ measurements on the oil remaining in the plugs showed an increase in the viscosity of the oil after each stage of extraction.

API gravity may be determined from viscosity using a determined equation for a particular type of crude oil. Alternatively, API gravity may be determined from viscosity using relationships such as those disclosed by various references. (See for example, Beal, C., "The Viscosity of Air, Water, Natural Gas, Crude Oil And Its Associated Gases at Oil Field Temperatures And Pressures", Trans. AIME Vol. 165, (1946) p. 94.)

The field's core was determined to be water wet. This follows because (a) the field's oil and water had similar viscosity, and (b) the water relaxation time in the cores was substantially shorter than bulk water, whereas the oil relaxation time was the same in the cores as in the bulk crude.

Thus, it is clear that the methods of the present invention measure the physical and chemical properties of oil or oil products using $^1H$ and/or $^{13}C$ NMR spectroscopy. Further, the methods may also determine the saturation of such oil or oil products in porous samples.

Many other variations and modifications may be made in the apparatus and techniques hereinbefore described by those having experience in this technology, without departing from the concept of the present invention. Accordingly, it should be clearly understood that apparatus and methods depicted in the accompanying drawings and referred to in the foregoing description are illustrative only and are not intended as limitations on the scope of the invention.

What is claimed is:

1. A method of obtaining a preselected property of a crude oil from a sample inside a porous medium which sample contains both crude oil and water, comprising the steps of:
    differentiating between crude oil and water based on frequency-resolved chemical shift NMR spectroscopy of said crude oil and water in said porous medium; and
    determining the preselected property of said crude oil from an NMR measured parameter in the chemical shift spectrum.

2. The method of claim 1, wherein said NMR parameter is the spin lattice relaxation time $T_1$ and said property of said crude oil is the viscosity.

3. The method of claim 1, wherein said NMR parameter is the spin lattice relaxation time $T_1$ and said property of said crude oil is the API gravity.

4. The method of claim 1, wherein said NMR parameter is the integrated aliphatic intensity and said property of said crude oil is the oil volume.

5. The method of claim 1, wherein said NMR parameter is the ratio of the integrated intensities in the aromatic band to the integrated intensity in the aliphatic band, and said property of said crude oil is the aromatic-/aliphatic ratio.

* * * * *